US010739042B2

(12) United States Patent
Zhang et al.

(10) Patent No.: US 10,739,042 B2
(45) Date of Patent: Aug. 11, 2020

(54) SYSTEMS AND METHODS FOR COOLING ELECTRICAL EQUIPMENT

(71) Applicant: Inertech IP LLC, Danbury, CT (US)

(72) Inventors: Ming Zhang, Ballwin, MO (US); John Costakis, Hyde Park, NY (US)

(73) Assignee: INERTECH IP LLC, Plano, TX (US)

( * ) Notice: Subject to any disclaimer, the term of this patent is extended or adjusted under 35 U.S.C. 154(b) by 126 days.

(21) Appl. No.: 15/479,588

(22) Filed: Apr. 5, 2017

(65) Prior Publication Data

US 2017/0205119 A1    Jul. 20, 2017

Related U.S. Application Data

(63) Continuation of application No. PCT/US2015/054789, filed on Oct. 8, 2015.
(Continued)

(51) Int. Cl.
*F25B 7/00* (2006.01)
*F25B 25/00* (2006.01)
(Continued)

(52) U.S. Cl.
CPC ............... *F25B 7/00* (2013.01); *F25B 25/005* (2013.01); *F25B 41/04* (2013.01); *F25B 49/02* (2013.01);
(Continued)

(58) Field of Classification Search
CPC .......... F25B 7/00; F25B 49/02; F25B 25/005; F25B 41/04; F25B 2500/18; H05K 7/20827
See application file for complete search history.

(56) References Cited

U.S. PATENT DOCUMENTS 5,396,621 A    3/1995 MacGregor et al.
5,715,693 A    2/1998 van der Walt et al.
(Continued)

FOREIGN PATENT DOCUMENTS

AU    2010256688 A1    1/2012
CN    101442893 A    5/2009
(Continued)

OTHER PUBLICATIONS

PCT International Search Report for International Application No. PCT/US/2011/043893 dated Feb. 17, 2012. (3 pages).
(Continued)

*Primary Examiner* — Kun Kai Ma
(74) *Attorney, Agent, or Firm* — Weber Rosselli & Cannon LLP

(57) ABSTRACT

The cooling systems of the present disclosure include a first refrigerant circuit in thermal communication with a heat load and in fluid communication with a main condenser, a free cooling circuit in fluid communication with the main condenser and a free-cooled water source, a chilled water circuit in fluid communication with the main condenser and an evaporator, and a second refrigerant circuit in fluid communication with the evaporator and a secondary condenser. The free cooling circuit is in thermal communication with the first refrigerant circuit via the main condenser, the chilled water circuit is in thermal communication with the first refrigerant circuit via the main condenser, and the second refrigeration circuit is in thermal communication with the chilled water circuit and the free cooling circuit. The second refrigeration circuit cools a fluid flowing in the chilled water circuit. Methods of operating a cooling system are also disclosed.

19 Claims, 3 Drawing Sheets

Related U.S. Application Data

(60) Provisional application No. 62/061,524, filed on Oct. 8, 2014.

(51) Int. Cl.
*H05K 7/20* (2006.01)
*F25B 41/04* (2006.01)
*F25B 49/02* (2006.01)

(52) U.S. Cl.
CPC ...... *H05K 7/20827* (2013.01); *F25B 2500/18* (2013.01)

(56) References Cited

U.S. PATENT DOCUMENTS

| | | | |
|---|---|---|---|
| 5,797,275 A | 8/1998 | Forsman | |
| 6,023,935 A | 2/2000 | Okazaki et al. | |
| 6,085,532 A * | 7/2000 | Sibik | F25B 49/02 62/177 |
| 6,116,048 A | 9/2000 | Hebert | |
| 6,324,860 B1 * | 12/2001 | Maeda | F24F 3/1423 62/271 |
| 6,374,627 B1 | 4/2002 | Schumacher et al. | |
| 6,574,104 B2 | 6/2003 | Patel et al. | |
| 6,640,561 B2 | 11/2003 | Roberto | |
| 6,694,326 B2 | 2/2004 | Mayhew et al. | |
| 6,714,412 B1 | 3/2004 | Chu et al. | |
| 6,738,770 B2 | 5/2004 | Gorman | |
| 6,772,604 B2 | 8/2004 | Bash et al. | |
| 6,819,563 B1 | 11/2004 | Chu et al. | |
| 6,826,922 B2 | 12/2004 | Patel et al. | |
| 6,859,366 B2 | 2/2005 | Fink | |
| 6,927,980 B2 | 8/2005 | Fukuda et al. | |
| 6,980,433 B2 | 12/2005 | Fink | |
| 6,988,241 B1 | 1/2006 | Guttman et al. | |
| 7,036,330 B2 | 5/2006 | Grabon et al. | |
| 7,046,514 B2 | 5/2006 | Fink et al. | |
| 7,106,590 B2 | 9/2006 | Chu et al. | |
| 7,139,762 B2 | 11/2006 | Labarge et al. | |
| 7,159,518 B2 | 1/2007 | Haas et al. | |
| 7,173,820 B2 | 2/2007 | Fink et al. | |
| 7,184,267 B2 | 2/2007 | Patel | |
| 7,203,694 B2 | 4/2007 | Gwizdaloski | |
| 7,216,291 B2 | 5/2007 | Kim | |
| 7,255,640 B2 | 8/2007 | Aldag et al. | |
| 7,278,273 B1 | 10/2007 | Whitted et al. | |
| 7,356,779 B2 | 4/2008 | Cras et al. | |
| 7,406,839 B2 | 8/2008 | Bean et al. | |
| 7,418,825 B1 | 9/2008 | Bean, Jr. | |
| 7,430,118 B1 | 9/2008 | Noteboom et al. | |
| 7,477,514 B2 | 1/2009 | Campbell et al. | |
| 7,480,675 B2 | 1/2009 | Folting et al. | |
| 7,511,959 B2 | 3/2009 | Belady et al. | |
| 7,569,954 B2 | 8/2009 | Tolle et al. | |
| 7,660,116 B2 | 2/2010 | Claassen et al. | |
| 7,660,121 B2 | 2/2010 | Campbell et al. | |
| 7,679,909 B2 | 3/2010 | Spearing et al. | |
| 7,684,193 B2 | 3/2010 | Fink et al. | |
| 7,698,287 B2 | 4/2010 | Becker et al. | |
| 7,724,516 B2 | 5/2010 | Harder et al. | |
| 7,724,518 B1 | 5/2010 | Carlson et al. | |
| 7,730,731 B1 | 6/2010 | Bash et al. | |
| 7,738,251 B2 | 6/2010 | Clidaras et al. | |
| 7,746,634 B2 | 6/2010 | Hom et al. | |
| 7,746,637 B2 | 6/2010 | Donowho et al. | |
| 7,804,687 B2 | 9/2010 | Copeland et al. | |
| 7,814,093 B2 | 10/2010 | Meyers et al. | |
| 7,831,539 B2 | 11/2010 | Folting et al. | |
| 7,836,597 B2 | 11/2010 | Datta et al. | |
| 7,849,395 B2 | 12/2010 | Ellis et al. | |
| 7,855,890 B2 | 12/2010 | Kashirajima et al. | |
| 7,856,838 B2 | 12/2010 | Hillis et al. | |
| 7,864,527 B1 | 1/2011 | Whitted | |
| 7,872,865 B2 | 1/2011 | Matsushima et al. | |
| 7,881,057 B2 | 2/2011 | Fink et al. | |
| 7,903,404 B2 | 3/2011 | Tozer et al. | |
| 7,903,409 B2 | 3/2011 | Patel et al. | |
| 7,907,406 B1 | 3/2011 | Campbell et al. | |
| 7,957,142 B2 | 6/2011 | Noteboom et al. | |
| 7,957,144 B2 | 6/2011 | Goettert et al. | |
| 7,961,463 B2 | 6/2011 | Belady et al. | |
| 7,963,119 B2 | 6/2011 | Campbell et al. | |
| 8,000,103 B2 | 8/2011 | Lipp et al. | |
| 8,004,839 B2 | 8/2011 | Sato et al. | |
| 8,006,496 B2 | 8/2011 | Carter | |
| 8,031,468 B2 | 10/2011 | Bean, Jr. et al. | |
| 8,077,457 B2 | 12/2011 | Gauthier et al. | |
| 8,095,866 B2 | 1/2012 | Folting et al. | |
| 8,113,010 B2 | 2/2012 | Carlson | |
| 8,118,084 B2 | 2/2012 | Harvey | |
| 8,120,916 B2 | 2/2012 | Schmidt et al. | |
| 8,146,374 B1 | 4/2012 | Zien | |
| 8,184,435 B2 | 5/2012 | Bean, Jr. et al. | |
| 8,189,334 B2 | 5/2012 | Campbell et al. | |
| 8,199,504 B2 | 6/2012 | Kashirajima et al. | |
| 8,208,258 B2 | 6/2012 | Campbell et al. | |
| 8,218,322 B2 | 7/2012 | Clidaras et al. | |
| 8,261,561 B2 | 9/2012 | Rigal et al. | |
| 8,261,565 B2 | 9/2012 | Borror et al. | |
| 8,289,710 B2 | 10/2012 | Spearing et al. | |
| 8,297,069 B2 | 10/2012 | Novotny et al. | |
| 8,320,125 B1 | 11/2012 | Hamburgen et al. | |
| 8,351,200 B2 | 1/2013 | Arimilli et al. | |
| 8,387,687 B2 | 3/2013 | Baer | |
| 8,392,035 B2 | 3/2013 | Patel et al. | |
| 8,405,977 B2 | 3/2013 | Lin | |
| 8,432,690 B2 | 4/2013 | Fink et al. | |
| 8,456,840 B1 | 6/2013 | Clidaras et al. | |
| 8,457,938 B2 | 6/2013 | Archibald et al. | |
| 8,472,182 B2 | 6/2013 | Campbell et al. | |
| 8,514,575 B2 | 8/2013 | Goth et al. | |
| 8,583,290 B2 | 11/2013 | Campbell et al. | |
| 8,689,861 B2 | 4/2014 | Campbell et al. | |
| 8,745,482 B2 | 6/2014 | Ellis et al. | |
| 8,760,863 B2 | 6/2014 | Campbell et al. | |
| 8,763,414 B2 | 7/2014 | Carlson et al. | |
| 8,780,555 B2 | 7/2014 | Fink et al. | |
| 8,783,052 B2 | 7/2014 | Campbell et al. | |
| 8,797,740 B2 | 8/2014 | Campbell et al. | |
| 8,813,515 B2 | 8/2014 | Campbell et al. | |
| 8,817,465 B2 | 8/2014 | Campbell et al. | |
| 8,817,474 B2 | 8/2014 | Campbell et al. | |
| 8,824,143 B2 | 9/2014 | Campbell et al. | |
| 8,839,638 B2 | 9/2014 | Kashirajima et al. | |
| 8,867,204 B1 | 10/2014 | Gardner | |
| 8,879,257 B2 | 11/2014 | Campbell et al. | |
| 2002/0054141 A1 | 5/2002 | Yen et al. | |
| 2002/0120604 A1 | 8/2002 | Labarge et al. | |
| 2002/0156794 A1 | 10/2002 | Mayhew et al. | |
| 2002/0172007 A1 | 11/2002 | Pautsch | |
| 2003/0061824 A1 | 4/2003 | Marsala | |
| 2004/0118136 A1 | 6/2004 | Patel et al. | |
| 2004/0190247 A1 | 9/2004 | Chu et al. | |
| 2004/0190270 A1 | 9/2004 | Aldag et al. | |
| 2004/0226686 A1 | 11/2004 | Maeda | |
| 2005/0039033 A1 | 2/2005 | Meyers et al. | |
| 2005/0128704 A1 | 6/2005 | Patel | |
| 2006/0000596 A1 | 1/2006 | Kranz et al. | |
| 2006/0074866 A1 | 4/2006 | Chamberlain et al. | |
| 2006/0075328 A1 | 4/2006 | Becker et al. | |
| 2006/0224568 A1 | 10/2006 | Debrito | |
| 2006/0287998 A1 | 12/2006 | Folting et al. | |
| 2007/0061746 A1 | 3/2007 | Folting et al. | |
| 2007/0064383 A1 | 3/2007 | Tanaka et al. | |
| 2007/0074130 A1 | 3/2007 | Folting et al. | |
| 2007/0167125 A1 | 7/2007 | Rasmussen et al. | |
| 2007/0227710 A1 | 10/2007 | Belady et al. | |
| 2007/0246555 A1 * | 10/2007 | Nishimura | F24D 3/08 237/2 B |
| 2007/0283710 A1 | 12/2007 | Gilbert et al. | |
| 2008/0024997 A1 | 1/2008 | Ghantiwala | |
| 2008/0055846 A1 | 3/2008 | Clidaras et al. | |
| 2008/0055848 A1 | 3/2008 | Hamburgen et al. | |
| 2008/0094797 A1 | 4/2008 | Coglitore et al. | |

(56) References Cited

U.S. PATENT DOCUMENTS

| | | |
|---|---|---|
| 2008/0123288 A1 | 5/2008 | Hillis |
| 2008/0158815 A1 | 7/2008 | Campbell et al. |
| 2008/0291626 A1 | 11/2008 | Nelson et al. |
| 2008/0305733 A1 | 12/2008 | Noteboom et al. |
| 2009/0086428 A1 | 4/2009 | Campbell et al. |
| 2009/0133866 A1 | 5/2009 | Campbell et al. |
| 2009/0154096 A1 | 6/2009 | Iyengar et al. |
| 2009/0207880 A1 | 8/2009 | Ahladas et al. |
| 2009/0211282 A1* | 8/2009 | Nishimura ............. F24D 17/02 62/238.6 |
| 2009/0216910 A1 | 8/2009 | Duchesneau |
| 2009/0241578 A1 | 10/2009 | Carlson et al. |
| 2009/0251860 A1 | 10/2009 | Belady et al. |
| 2009/0276691 A1 | 11/2009 | Galuten |
| 2009/0327852 A1 | 12/2009 | MacGregor et al. |
| 2010/0032142 A1 | 2/2010 | Copeland et al. |
| 2010/0049362 A1* | 2/2010 | Hatuka ................. A47J 31/005 700/232 |
| 2010/0077788 A1 | 4/2010 | Lewis |
| 2010/0136895 A1 | 6/2010 | Sgro |
| 2010/0144265 A1 | 6/2010 | Bednarcik et al. |
| 2010/0165498 A1 | 7/2010 | Merrow et al. |
| 2010/0300650 A1 | 12/2010 | Bean, Jr. |
| 2010/0325526 A1 | 12/2010 | Ellis et al. |
| 2011/0100045 A1 | 5/2011 | Carlson |
| 2011/0154842 A1 | 6/2011 | Heydari et al. |
| 2011/0198057 A1 | 8/2011 | Lange et al. |
| 2011/0265983 A1 | 11/2011 | Pedersen |
| 2011/0270876 A1 | 11/2011 | Gill et al. |
| 2011/0271695 A1 | 11/2011 | Kashirajima et al. |
| 2011/0276917 A1 | 11/2011 | Error |
| 2011/0313576 A1 | 12/2011 | Nicewonger |
| 2012/0010754 A1 | 1/2012 | Matteson |
| 2012/0060538 A1* | 3/2012 | Saito ..................... F24H 4/02 62/324.1 |
| 2012/0079363 A1 | 3/2012 | Folting et al. |
| 2012/0103591 A1 | 5/2012 | Tozer |
| 2012/0117996 A1* | 5/2012 | Hinde ...................... F25B 7/00 62/192 |
| 2012/0125023 A1 | 5/2012 | Kopko et al. |
| 2012/0167670 A1 | 7/2012 | Bean, Jr. et al. |
| 2012/0174612 A1 | 7/2012 | Madara et al. |
| 2012/0216551 A1* | 8/2012 | Minor .................... C09K 5/045 62/79 |
| 2013/0269380 A1* | 10/2013 | Oya ..................... F25B 41/043 62/190 |
| 2013/0312445 A1* | 11/2013 | Isetti ................. B01D 53/1425 62/271 |
| 2014/0223931 A1* | 8/2014 | Shapiro ................ F25B 49/005 62/89 |
| 2015/0176865 A1* | 6/2015 | McDonnell ........... F25B 29/003 62/506 |
| 2015/0192345 A1* | 7/2015 | McDonnell ............. F25D 17/02 165/104.14 |
| 2015/0345835 A1* | 12/2015 | Martin ..................... F25B 7/00 62/238.3 |
| 2016/0084553 A1* | 3/2016 | Seki ........................ F25B 1/00 62/204 |

FOREIGN PATENT DOCUMENTS

| | | |
|---|---|---|
| CN | 100584168 C | 1/2010 |
| CN | 101686629 A | 3/2010 |
| CN | 102334396 A | 1/2012 |
| CN | 102461357 A | 5/2012 |
| DE | 20 2004 003 309 U1 | 8/2004 |
| DE | 20 2004 003 310 U1 | 8/2004 |
| DE | 102012218873 A1 | 5/2013 |
| EP | 1604263 A2 | 12/2005 |
| GB | 2 444 981 | 6/2008 |
| JP | 2007-087498 A | 4/2007 |
| JP | 2008287733 A | 11/2008 |
| JP | 5113203 B2 | 1/2013 |
| JP | 5209584 B2 | 6/2013 |
| JP | 5243929 B2 | 7/2013 |
| JP | 5244058 B2 | 7/2013 |
| JP | 5301009 B2 | 9/2013 |
| JP | 5308750 B2 | 10/2013 |
| JP | 201452123 A | 3/2014 |
| WO | 1999063797 A1 | 12/1999 |
| WO | 2009/114103 A1 | 9/2009 |
| WO | 2009/156647 A1 | 12/2009 |
| WO | 2010/087915 A1 | 8/2010 |
| WO | 2010/141205 A1 | 12/2010 |
| WO | 2011163532 A2 | 12/2011 |
| WO | 2012118553 A2 | 9/2012 |
| WO | 2012118554 A1 | 9/2012 |

OTHER PUBLICATIONS

PCT International Search Report for International Application No. PCT/US/2011/041710 dated Feb. 24, 2012. (10 pages).

Sylvain Quoilin and Vincent Lemort, "Technological and Economical Survey of Organic Rankine Cycle Systems", symposium paper, Thermodynamics Laboratory, University of Liege-5.sup.th European Conference Economics and Management of Energy inIndustry—Algarve, Portugal Centro de Energia e Tecnologia; Apr. 14-17, 2009, pp. 1-12.

Coolcentric "Products—Coolcentric Coolant Distribution Units", pp. 1-2, website, http://www.coolcentric.com/products/coolant-distribution.sub.--u- nits.php, Feb. 22, 2012.

Coolcentric "Products—Technology Overview", pp. 1-2, website, http://www.coolcentric.com/priducts/technology.php, Feb. 22, 2012.

Reduced-Order Modeling of Multiscale Turbulent Convection: Application to Data Center Thermal Management, May 2006, <https://smartech.gatech.edu/bitstream/handle/1853/14605/rambo_jeffrey_200605_phd.pdf>.

Weatherman: Automated, Online, and Predictive Thermal Mapping and Management for Data Centers, 2006, <http://www.cse.iitb.ac.in/~puru/courses/spring14/cs695/downloads/weatherman.pdf>.

PCT International Search Report for International Application No. PCT/US/2011/041710 dated Feb. 24, 2012.

International Search Report issued in related application PCT/US2011/067679 dated Aug. 30, 2012.

Australian Examination Report for Australian Application No. 2011270812 dated Feb. 8, 2016.

Office Action for corresponding Korean Application No. 10-2013-7001622 dated Jul. 17, 2017.

HP Modular Cooling System Site Preparation Guide, 2006-2007, <http://h20565.www2.hp.com/hpsc/doc/public/display?docId=emr_na-c00613691>.

Air-Cooled High-Performance Data Centers: Case Studies and Best Methods, 2006, <http://www.intel.in/content/dam/www/public/us/en/documents/white-papers/date-center-efficiency-air-cooled-bkms-paper.pdf>.

Liebert Xtreme Density—System Design Manual, 2009, <http://shared.liebert.com/SharedDocuments/LiebertFiles/SL_16655_REV09_07-09.pdf>.

Data Center Evolution a Tutorial on State of the Art, Issues, and Challenges, 2009, <http://www.cse.iitb.ac.in/~puru/courses/autumn12/cs695/downloads/dcevolve.pdf>.

International Preliminary Report on Patentability for PCT/US2015/054789 dated Apr. 20, 2017.

* cited by examiner

SYSTEMS AND METHODS FOR COOLING ELECTRICAL EQUIPMENT

CROSS-REFERENCE TO RELATED APPLICATIONS

This application is a continuation of International Application No. PCT/US2015/054789, filed on Oct. 8, 2015, which claims the benefit of, and priority to, U.S. Provisional Application No. 62/061,524, filed on Oct. 8, 2014, the entire content of each of which is incorporated by reference herein.

BACKGROUND

Technical Field

The present disclosure relates generally to cooling systems, and more particularly, to systems for, and methods of, cooling electrical equipment.

Background of Related Art

Conventional cooling systems do not exhibit significant reductions in energy use in relation to decreases in load demand. Air-cooled direct expansion (DX), water-cooled chillers, heat pumps, and even large fan air systems do not scale down well to light loading operation. Rather, the energy cost per ton of cooling increases dramatically as the output tonnage is reduced on conventional systems. This can be mitigated somewhat with the addition of fans, pumps, and chiller variable frequency drives (VFDs); however, their turn-down capabilities are still limited by such issues as minimum flow constraints for thermal heat transfer of air, water, and compressed refrigerant. For example, a 15% loaded air conditioning system requires significantly more than 15% of its 100% rated power use. In most cases such a system requires as much as 40-50% of its 100% rated power use to provide 15% of cooling work.

Conventional commercial, residential, and industrial air conditioning cooling circuits require high electrical power draw when energizing the compressor circuits to perform the cooling work. Some compressor manufacturers have mitigated the power in-rush and spikes by employing energy saving VFDs and other apparatuses for step loading control functions. However, the current systems employed to perform cooling functions are extreme power users.

Existing refrigerant systems do not operate well under partial or lightly loaded conditions, nor are they efficient at low ambient temperature or "shoulder seasonal" operation in cooler climates. These existing refrigerant systems are generally required to be fitted with low ambient kits in cooler climates, and other energy robbing circuit devices, such as hot-gas bypass in order to provide a stable environment for the refrigerant under these conditions.

Compressors on traditional cooling systems rely on tight control of the vapor evaporated in an evaporator coil. This is accomplished by using a metering device (or expansion valve) at the inlet of the evaporator which effectively meters the amount of liquid that is allowed into the evaporator. The expanded liquid absorbs the heat present in the evaporator coil and leaves the coil as a super-heated vapor. Tight metering control is required in order to ensure that all of the available liquid has been boiled off before leaving the evaporator coil. This can create several problems under low loading conditions, such as uneven heat distribution across a large refrigerant coil face or liquid slugging to the compressor. This latter scenario can damage or destroy a compressor.

To combat the inflexibility problems that exist on the low-end operation of refrigerant systems, manufacturers employ hot-gas bypass and other low-ambient measures to mitigate slugging and uneven heat distribution. These low-ambient measures create a false load and cost energy to operate.

Conventional air-cooled air conditioning equipment is inefficient. The kW per ton (kilowatt electrical per ton of refrigeration or kilowatt electrical per 3.517 kilowatts of refrigeration) for the circuits is more than 1.0 kW per ton during operation in high dry bulb ambient conditions.

Evaporative assist condensing air conditioning units exhibit better kw/ton energy performance over air-cooled DX equipment. However, they still have limitations in practical operation in climates that are variable in temperature. They also require a great deal more in maintenance and chemical treatment costs.

Central plant chiller systems that temper, cool, and dehumidify large quantities of hot process intake air, such as intakes for turbine inlet air systems, large fresh air systems for hospitals, manufacturing, casinos, hotel, and building corridor supply systems are expensive to install, costly to operate, and are inefficient over the broad spectrum of operational conditions.

Existing compressor circuits have the ability to reduce power use under variations or reductions in system loading by either stepping down the compressors or reducing speed (e.g., using a VFD). However, there are limitations to the speed controls as well as the steps of reduction.

Gas turbine power production facilities rely on either expensive chiller plants and inlet air cooling systems, or high volume water spray systems as a means to temper the inlet combustion air. The turbines lose efficiency when the entering air is allowed to spike above 15° C. and possess a relative humidity (RH) of less than 60%. The alternative to the chiller plant assist is a high volume water inlet spray system. High volume water inlet spray systems are less costly to build and operate. However, such systems present heavy maintenance costs and risks to the gas turbines, as well as consume huge quantities of potable water.

Hospital intake air systems require 100% outside air. It is extremely costly to cool this air in high ambient and high latent atmospheres using the conventional chiller plant systems.

Casinos require high volumes of outside air for ventilation to casino floors. They are extremely costly to operate, and utilize a tremendous amount of water especially in arid environments, e.g., Las Vegas, Nev. in the United States.

Middle eastern and desert environments have a high impact on inlet air cooling systems due to the excessive work that a compressor is expected to perform as a ratio of the inlet condensing air or water versus the leaving chilled water discharge. The higher the delta, the more work the compressor has to perform with a resulting higher kw/ton electrical draw. As a result of the high ambient desert environment, a cooling plant will expend nearly double the amount of power to produce the same amount of cooling in a less arid environment.

High latent load environments, such as in Asia, India, Africa, and the southern hemispheres, require high cooling capacities to handle the effects of high moisture in the atmosphere. The air must be cooled and the moisture must be eliminated to provide comfort cooling for residential, commercial, and industrial outside air treatment applications. High latent heat loads cause compressors to work harder and require a higher demand to handle the increased work load.

Existing refrigeration process systems are normally designed and built in parallel. The parallel systems do not operate efficiently over the broad spectrum of environmental conditions. They also require extensive operating control algorithms to enable the various pieces of equipment on the system to operate as one efficiently. There are efficiencies that are lost across the operating spectrum because the systems are piped, operated, and controlled in parallel.

There have not been many innovations in air conditioning systems and cooling equipment that address the inherent limitations of the various refrigerant cooling processes. Each conventional system exhibits losses in efficiency at high-end, shoulder, and low-end loading conditions. In addition to the non-linear power versus loading issues, environmental conditions have extreme impacts on the individual cooling processes. The conventional systems are too broadly utilized across a wide array of environmental conditions. The results are that most of the systems operate inefficiently for a vast majority of time. The reasons for the inefficiencies are based on operator misuse, misapplication for the environment, or losses in efficiency due to inherent limiting characteristics of the cooling equipment.

SUMMARY

In aspects, the present disclosure features a cooling system. The cooling system includes a first refrigerant circuit, a free cooling circuit, a chilled water circuit, and a second refrigerant circuit. The first refrigerant circuit is in thermal communication with a heat load and in fluid communication with a main condenser. The free cooling circuit is in fluid communication with the main condenser and a free-cooled water source. The free cooling circuit is in thermal communication with the first refrigerant circuit via the main condenser. The chilled water circuit is in fluid communication with the main condenser and an evaporator. The chilled water circuit is in thermal communication with the first refrigerant circuit via the main condenser. The second refrigerant circuit is in fluid communication with the evaporator and a secondary condenser. The second refrigeration circuit is in thermal communication with the chilled water circuit and the free cooling circuit.

In aspects, the cooling system further includes a first control valve placed in an open position and a second control valve placed in a closed position thereby causing a refrigerant of the first refrigerant circuit to be condensed by a fluid flowing through the main condenser that is cooled solely by the free cooling circuit.

In aspects, the cooling system further includes a first, second, and third control valve. The first and third control valves are placed in a closed position and the second control valve is placed in an open position, thereby causing a refrigerant of the first refrigerant circuit to be condensed by fluid flowing through the main condenser that is cooled by the chilled water circuit. The first, second, and third control valves may be placed in a partially open position, thereby causing the refrigerant of the first refrigerant circuit to be condensed by a fluid flowing through the main condenser that is cooled by the free cooling circuit and the chilled water circuit.

In aspects, the cooling system further includes a first water pump capable of pumping fluid through the chilled water circuit.

In aspects, the second refrigerant circuit includes a compressor.

In aspects, the chilled water circuit includes a one-way valve which inhibits fluid from flowing from an inlet port of the evaporator and toward the first water pump.

In aspects, the present disclosure features a method of operating a cooling system. The method includes providing a cooling system including a first refrigerant circuit in thermal communication with a heat load and in fluid communication with a main condenser, a free cooling circuit in fluid communication with the main condenser and a free-cooled water source, the free cooling circuit being in thermal communication with the first refrigerant circuit via the main condenser, a chilled water circuit in fluid communication with the main condenser and an evaporator, the chilled water circuit being in thermal communication with the first refrigerant circuit via the main condenser, and a second refrigerant circuit in fluid communication with the evaporator and a secondary condenser, the second refrigeration circuit being in thermal communication with the chilled water circuit and the free cooling circuit. During a low wet-bulb temperature condition, a refrigerant of the first refrigerant circuit flowing through the main condenser is condensed by a fluid flowing through the main condenser that is cooled solely by the free cooling circuit.

In aspects, the method further includes placing a first control valve in an open position to enable fluid flowing through the free cooling circuit to flow through the main condenser and placing a second control valve in a closed position to inhibit fluid flowing through the free cooling circuit to flow through the secondary condenser, thereby causing a refrigerant of the first refrigerant circuit flowing through the main condenser to be condensed by a fluid flowing through the main condenser that is cooled solely by the free cooling circuit.

In aspects, during a high wet-bulb temperature, a refrigerant of the first refrigerant circuit flowing through the main condenser is condensed by a fluid flowing through the main condenser that is cooled by the chilled water circuit.

In aspects, the method further includes placing a first control valve in a closed position, a second control valve in an open position, and a third control valve in an open position to inhibit fluid flowing through the free cooling circuit to flow through the main condenser and to enable fluid flowing through the free cooling circuit to flow through the secondary condenser thereby causing a refrigerant of the first refrigerant circuit flowing through the main condenser to be condensed by a fluid flowing through the chilled water circuit.

In aspects, during a shoulder condition, a refrigerant of the first refrigerant circuit flowing through the main condenser is condensed by a fluid flowing through the main condenser that is cooled by a combination of the free cooling circuit and the chilled water circuit.

In aspects, a first, second, and third control valve are placed in a partially open position thereby causing a refrigerant of the first refrigerant circuit flowing through the main condenser to be condensed by a fluid flowing through the main condenser that is cooled by a combination of the free cooling circuit and chilled water circuit.

In aspects, the chilled water circuit further includes a first water pump and the second refrigerant circuit includes a compressor. The first water pump circulates fluid through the first water circuit and the compressor circulates a refrigerant through the second refrigerant circuit. During a low wet-bulb temperature condition, the first water pump and the compressor are placed in an idle state or condition.

In aspects, the present disclosure features another method of operating a cooling system. The method includes determining a temperature and, if the temperature is determined to be low, closing a first valve to prevent cooling water from a fluid cooler from flowing through a secondary condenser in fluid communication with a second refrigerant circuit, and opening a second valve to allow cooling water from a fluid cooler to flow through a main condenser in fluid communication with a first refrigerant circuit in thermal communication with a heat load. If the temperature is determined to be high, the method further includes opening the first valve to allow the cooling water from the fluid cooler to flow through the secondary condenser, closing the second valve to prevent cooling water from a fluid cooler to flow through the main condenser, starting a pump in a chilled water circuit in fluid communication with the main condenser and an evaporator of the second refrigerant circuit, and starting a compressor in the second refrigerant circuit.

In aspects, the method further includes, if the temperature is determined to be at an intermediate temperature between the low temperature and the high temperature, partially opening the first valve, partially opening the second valve; and starting the pump and the compressor to cool the cooling water from the fluid cooler to a lower temperature which condenses the refrigerant in the first refrigerant circuit.

In aspects, the method further includes, if the temperature is determined to be low, idling the pump, and idling the compressor.

In aspects, the method further includes determining whether the cooling water from the fluid cooler is not cool enough to condense the refrigerant in the first refrigerant circuit and opening the first valve, closing the second valve, starting the pump, and starting the compressor if the temperature is determined to be a high temperature and if the cooling water from the fluid cooler is determined to be not cool enough to condense the refrigerant in the first refrigerant circuit.

In aspects, the temperature is ambient temperature or wet-bulb temperature.

DETAILED DESCRIPTION

The present disclosure features a cooling system for electrical equipment such as data centers or the like having a high heat rejection temperature and high sensible heat ratio compared to general air conditioning or refrigeration applications.

The cooling system maximizes "free" cooling (i.e., no compressor operation) and can do mechanical cooling under high ambient temperatures (or high wet bulb temperatures). The cooling system includes a pumped refrigerant loop and cooling water sub-system. When ambient temperature (or wet bulb temperature) is low, the cooling water from a fluid cooler, e.g., a cooling tower, is used to condense vapor refrigerant, such as R134a, in the pumped loop to provide "free" cooling (i.e., no compressor operation).

When ambient temperature gets high, the water circuiting is switched such that an isolated chilled water loop is formed to condense the pumped refrigerant with the chilled water flowing between the condenser of the pumped refrigerant loop ("main" condenser) and the evaporator of a compressor loop (or chiller). Further, at high ambient conditions, the cooling water from the fluid cooler only flows to the compressor loop condenser.

In some cooling systems, when the ambient temperature is high, the cooling water from the fluid cooler, e.g., an outdoor cooling tower, is cooled by a compressor loop (chiller) by a limited amount. Thus, those cooling systems may become inefficient at higher ambient temperatures (e.g., above roughly 24° C. wet bulb). To overcome this, the cooling system of the present disclosure switches the condensing water circuit from cooling water coming from the fluid cooler to an isolated chilled water circuit that can be cooled to whatever water temperature is needed. Thus, the cooling systems of the present disclosure may be more efficient in warmer outdoor conditions.

Figure 1:
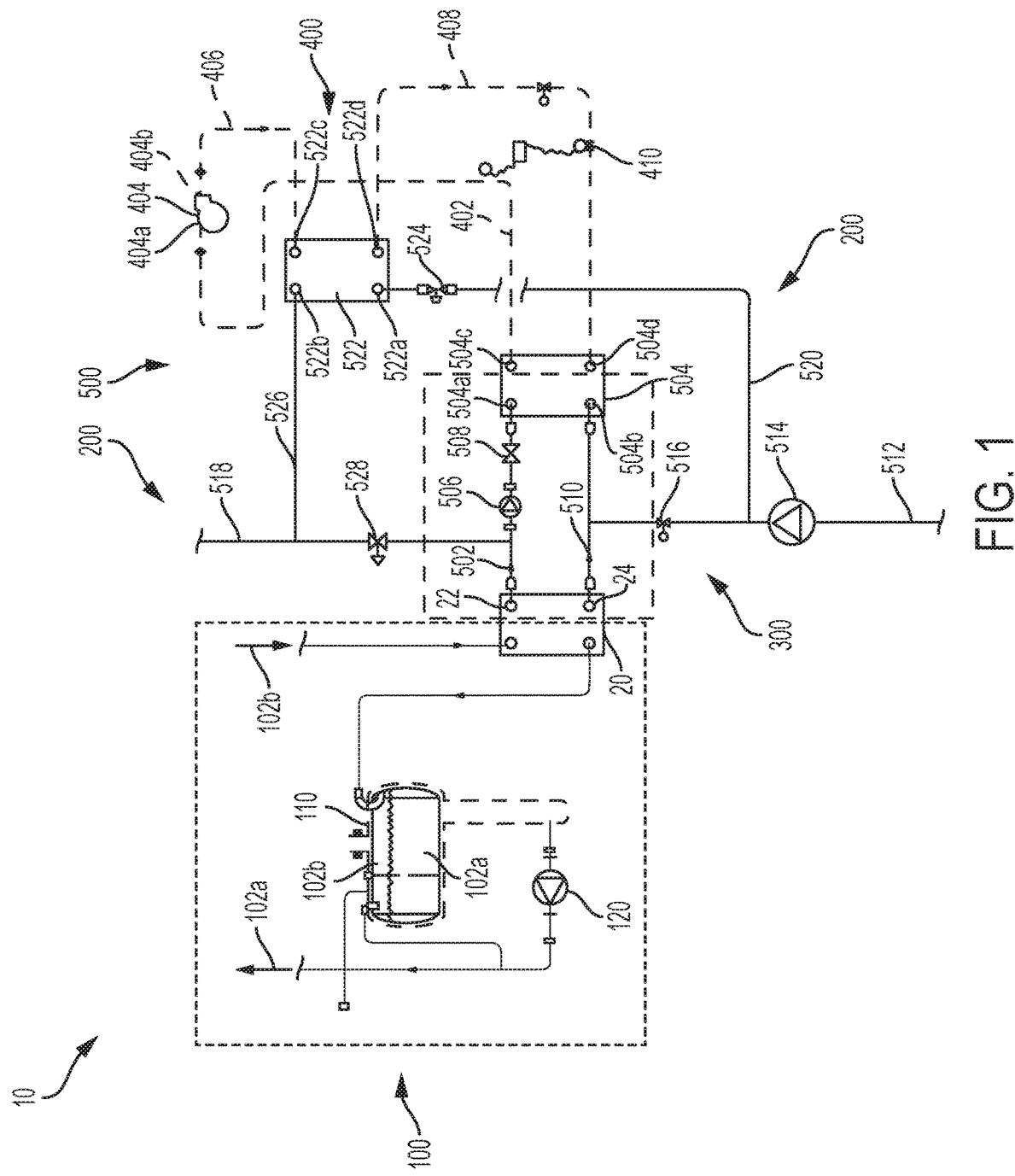
FIG. 1 is a schematic flow diagram of a cooling system in accordance with embodiments of the present disclosure.

FIG. 1 illustrates a cooling system provided in accordance with the present disclosure and generally referred to as reference numeral 10. Cooling system 10 includes four circuits: first refrigerant circuit 100; "free" water cooling circuit 200 (also referred to as the free cooling circuit); chilled water circuit 300; and second refrigerant circuit 400 (also referred to as the compressor circuit).

First refrigerant circuit 100 is an overfed refrigerant circuit or other suitable refrigerant circuit that circulates a refrigerant in liquid form (i.e., liquid refrigerant 102a) to evaporators (not shown) near electronic equipment such as computer server racks (not shown) or other similar electrical devices. In embodiments, the refrigerant is R-134a, although the use of other suitable refrigerants is contemplated. In this manner, the liquid refrigerant 102a is in thermal communication with the evaporators such that the liquid refrigerant 102a absorbs the heat generated by the electrical equipment and vaporizes.

The vapor refrigerant 102b is then carried to a main condenser 20 in thermal communication with free cooling circuit 200 and/or chilled water circuit 300. As will be described in further detail below, in operation, cooling system 10 is capable of using only free cooling circuit 200, only chilled water circuit 300, or a combination of free cooling circuit 200 and chilled water circuit 300. The vapor refrigerant 102b is condensed within main condenser 20 into liquid and thereafter flows to a receiver 110. Receiver 110 may be any suitable receiver capable of separating vapor refrigerant 102b from liquid refrigerant 102a, such as a vapor-liquid separator. In this manner, receiver 110 ensures that only liquid refrigerant 102a is delivered to the evaporators, thereby increasing the overall efficiency of cooling system 10.

Liquid refrigerant 102a exits receiver 110 and enters a refrigerant pump 120. Refrigerant pump 120 may be any suitable liquid pump capable of circulating R-134a or other suitable refrigerants. Refrigerant pump 120 pumps liquid refrigerant 102a to the evaporators adjacent the electrical equipment to complete first refrigerant circuit 100.

FIG. 1 also illustrates free cooling circuit 200, chilled water circuit 300, and compressor circuit 400. For purposes of clarity, each of free cooling circuit 200, chilled water circuit 300, and compressor circuit 400 will be collectively described as condensing system 500.

Chilled water circuit 300 includes a first water line 502 connecting a water outlet 22 of main condenser 20 to a water inlet 504a of an evaporator 504, thereby placing main condenser in fluid communication with evaporator 504. Chilled water circuit 300 further includes a first water pump 506 disposed on and in fluid communication with first water line 502. First water pump 506 may be any suitable fluid pump capable of pumping water such as a centrifugal pump, an axial pump, a positive displacement pump, or the like.

A check valve 508 is disposed on and in fluid communication with first water line 502 between first water pump 506 and water inlet 504a of evaporator 504. Check valve 508 ensures that water is only permitted to flow through first water line 502 in a direction from the water outlet 22 of main condenser 20 to water inlet 504a of evaporator 504 and not vice versa. Chilled water circuit 300 of condensing system 500 further includes a second water line 510 connecting water inlet 24 of main condenser 20 to a water outlet 504b of evaporator 504, thereby completing a circuit between main condenser 20 and evaporator 504.

A first fluid cooler line 512 is disposed on an outlet of a fluid cooler (not shown) and terminates on and is in fluid communication with second water line 510. In embodiments, a second water pump 514 may be disposed on and in fluid communication with first fluid cooler line 512. The second water pump 514 may be used to circulate water through the free cooling circuit 200. Second water pump 514 may be any suitable fluid pump such as a centrifugal pump, an axial pump, a positive displacement pump, or the like. Second water pump 514 may be oriented such that cooled water is drawn from the fluid cooler (not shown) and expelled into water inlet 24 of main condenser 20.

A second control valve 516 is disposed on and in fluid communication with first fluid cooler line 512. Second control valve 516 may be any suitable control valve compatible with water and capable of completely closing such that water is no longer able to flow through second control valve 516. In embodiments, second control valve 516 is electronically controlled, although other control configurations are also contemplated, such as pneumatic control, diaphragm control, manual control, or the like. A second fluid cooler line 518 is disposed on first water line 502 and terminates at an inlet of the fluid cooler (not shown). In this manner, second fluid cooler line 518 enables first water line 502 and the fluid cooler (not shown) to be in fluid communication, thereby completing free cooling circuit 200.

A first diversion line 520 branches off first fluid cooler line 512 and terminates at a water inlet 522a of a secondary condenser 522. A first control valve 524 is disposed on and in fluid communication with first diversion line 520. First control valve 524 may be any suitable control valve compatible with water and capable of completely closing such that water is no longer able to flow through first control valve 524. In embodiments, first control valve 524 is electronically controlled, although other configurations are also contemplated, such as pneumatic, diaphragm, manual, or the like. A second diversion line 526 is disposed on a water outlet 522b of secondary condenser 522 and terminates on and is in fluid communication with second fluid cooler line 518.

In embodiments, a third control valve 528 may be disposed on and in fluid communication second fluid cooler line 518. The third control valve 528 may be used to isolate the chilled water circuit 300. Third control valve 528 may be any suitable control valve compatible with water and capable of completely closing such that water is no longer able to flow through the third control valve 528. In embodiments, third control valve 528 is electronically controlled, although other configurations are also contemplated, such as pneumatic, diaphragm, manual, or the like.

As illustrated in FIG. 1, compressor circuit 400 is in fluid communication with evaporator 504 and secondary condenser 522. An evaporator outlet line 402 is disposed on a refrigerant outlet 504c of evaporator 504 and terminates at an inlet side 404a of compressor 404. Compressor 404 may be any suitable compressor capable of compressing refrigerants, such as reciprocating, rotary screw, centrifugal, scroll, or the like. A condenser inlet line 406 is disposed on an outlet side 404b of compressor 404 and terminates at a refrigerant inlet 522c of secondary condenser 522. A condenser outlet line 408 is disposed on a refrigerant outlet 522d of secondary condenser 522 and terminates at a refrigerant inlet 504d of evaporator 504. An expansion valve 410 is disposed on and in fluid communication with condenser outlet line 408. In this manner, expansion valve 410 meters the flow of a second refrigerant circulating within compressor circuit 400, thereby permitting more efficient heat transfer to occur within evaporator 504. It is contemplated that expansion valve 410 may be any suitable expansion valve suitable for use with refrigerants, such as internally equalized, externally equalized, or the like. It is further contemplated that the second refrigerant may be any suitable refrigerant for use in cooling water. In one embodiment, the second refrigerant is R-134a, although the use of other suitable refrigerants is also contemplated.

Figure 2:
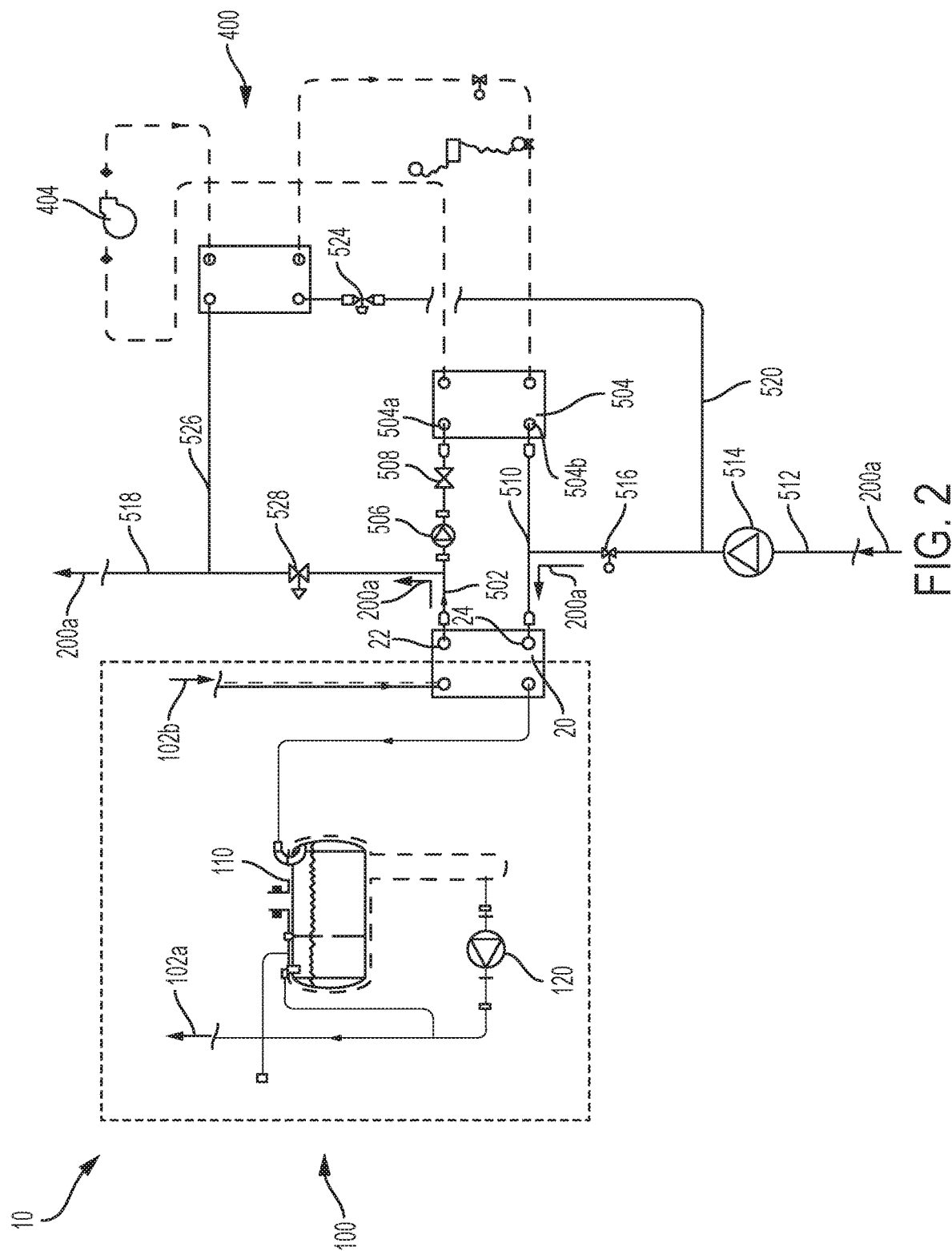
FIG. 2 is a schematic flow diagram showing the direction of flow of fluid in the chilled water circuit of the cooling system of FIG. 1.
Figure 3:
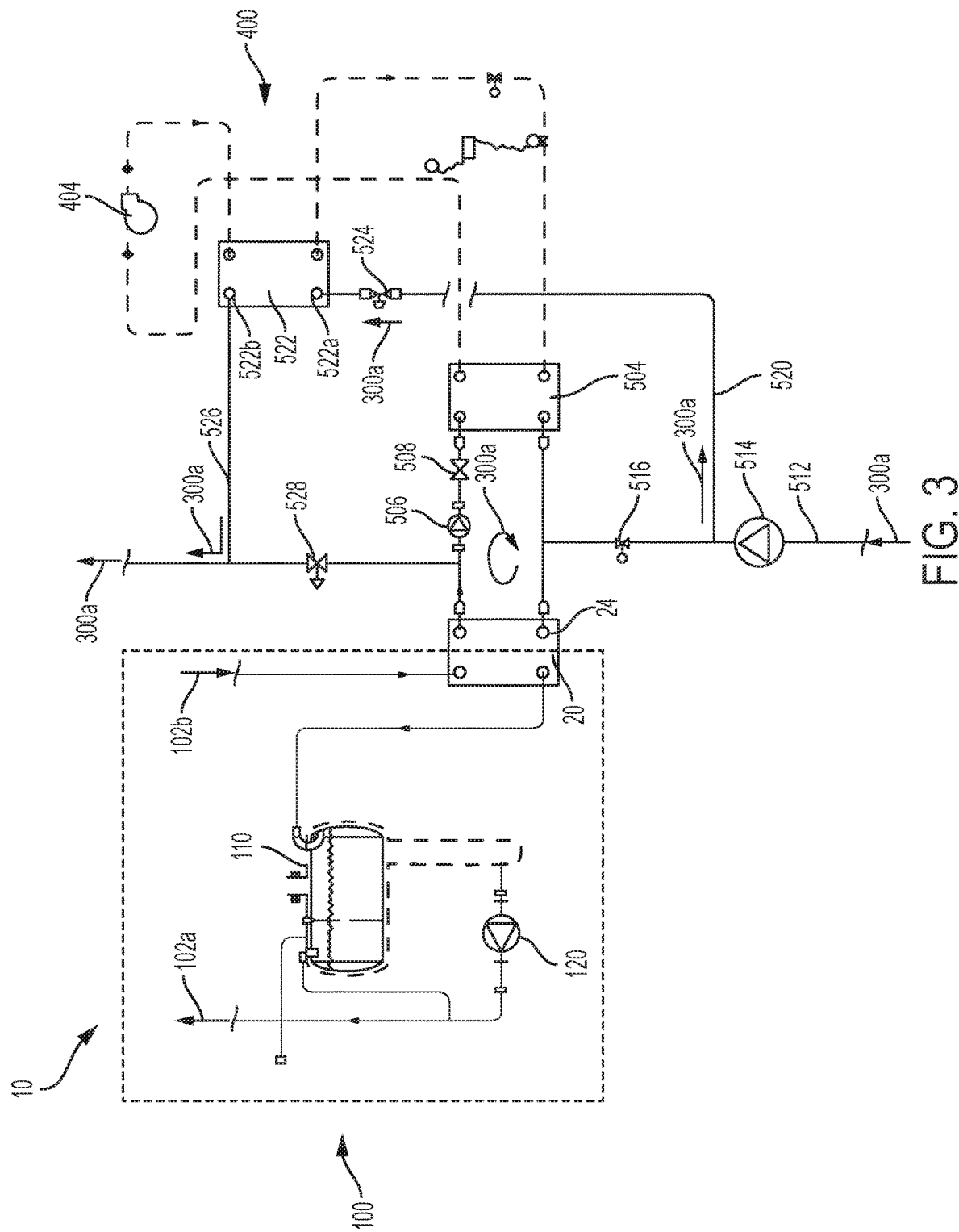
FIG. 3 is a schematic flow diagram showing the direction of flow of fluid in both the chiller water circuit and the free cooling circuit of the cooling system of FIG. 1, illustrating both circuits being used simultaneously.

With reference to FIGS. 1-3, the operation of cooling system 10 is described below. As illustrated in FIG. 2, when the ambient temperature or wet-bulb temperature of the ambient air is low (e.g., below 18° C. wet bulb), cooling system 10 can function by solely utilizing free cooling circuit 200. The direction of flow of fluid within free cooling circuit 200 is indicated by reference numeral 200a. Second control valve 516 is placed in an open position permitting water to flow from the fluid cooler (not shown), such as a cooling tower, into the water inlet 24 of main condenser 20. First control valve 524 is placed in a closed position thereby inhibiting water flow into water inlet 522a of secondary condenser 522. Further, first water pump 506 and compressor 404 are placed in an idle state or condition. In this manner, in cooperation with check valve 508, water flow is inhibited from flowing through evaporator 504 due to static equilibrium of the pressure of the water flowing through free cooling circuit 200. Specifically, water flows through first fluid cooler line 512 and into second water line 510.

At this point, water initially flows into the water outlet 504b of evaporator 504, through evaporator 504, and into first water line 502. However, the flow of water through first water line 502 is inhibited by check valve 508. Thus, water must flow through second water line 510, into water inlet 24 of main condenser 20, through main condenser 20, out of water outlet 22 of main condenser 20, and into first water line 502. Thereafter, the water is forced through second fluid cooler line 518 and into the fluid cooler due to the pressure acting upon the water in evaporator 504.

As illustrated in FIG. 3, when the wet-bulb temperature of the ambient air is high (e.g., above 24° C. wet bulb), chilled water circuit 300 is used and water circulates as illustrated by the arrow 300a. In this manner, second and third control valves 516, 528 are placed in a closed position, thereby diverting the water flowing from the fluid cooler into first diversion line 520. First control valve 524 is placed in an open position permitting the water flowing through first diversion line 520 to enter water inlet 522a of secondary condenser 522. At this point, the water flows out of water outlet 522b of secondary condenser 522, through second diversion line 526, through second fluid cooler line 518, and into the fluid cooler. As third control valve 528 is in a closed position, water is inhibited from flowing back into first water line 502.

During the operation of chilled water circuit 300, first water pump 506 and compressor 404 are placed in an "on" condition such that water is circulated within chilled water circuit 300 and the second refrigerant is circulated within compressor circuit 400. In this manner, the water isolated within chilled water circuit 300 is cooled within evaporator 504. Further, the water flowing through secondary condenser 522 condenses the second refrigerant flowing through compressor circuit 400. Therefore, the first refrigerant circulating within first refrigerant circuit 100 is more deeply cooled within main condenser 20 by the water circulating within chilled water circuit 300, thereby providing increased performance during high wet-bulb ambient temperatures.

In the instance when the wet-bulb temperature is in a shoulder condition or an intermediate condition (e.g., between 18° C. and 24° C. wet bulb), a combination of free cooling circuit 200 and chilled water circuit 300 may be used. In this manner, first, second, and third control valves 524, 516, 528 are placed in a position between fully open and fully closed. In this manner, the load placed upon compressor circuit 400 may be reduced by the cooling capacity of the fluid cooler of free cooling circuit 200. Specifically, chilled water circuit 300 and compressor circuit 400 are used to trim the temperature of water flowing through free cooling circuit 200 and main condenser 20. It is contemplated that the position of each of first, second, and third control valves 524, 516, 528 may be varied in order to place greater or less load upon compressor circuit 400 as is needed based upon environmental conditions.

The methods of operating cooling systems described herein may be implemented by control systems known to those skilled in the art. The control systems may include a computer having a processor and memory, a microcontroller, a digital signal processor, or other similar hardware programmed or configured to perform the functions described herein.

Although embodiments have been described in detail with reference to the accompanying drawings for the purpose of illustration and description, it is to be understood that the inventive processes and apparatus are not to be construed as limited. It will be apparent to those of ordinary skill in the art that various modifications to the foregoing embodiments may be made without departing from the scope of the disclosure.

What is claimed is:

1. A cooling system comprising:
a first refrigerant circuit in thermal communication with a heat load and in fluid communication with a main condenser;
a free cooling circuit in fluid communication with the main condenser and a free-cooled water source, the free cooling circuit being in thermal communication with the first refrigerant circuit via the main condenser;
a chilled water circuit in fluid communication with the main condenser and an evaporator, the chilled water circuit being in thermal communication with the first refrigerant circuit via the main condenser;
a second refrigerant circuit in fluid communication with the evaporator and a secondary condenser, the second refrigeration circuit being in thermal communication with the chilled water circuit and the free cooling circuit, wherein during a low wet-bulb temperature condition of ambient air, a refrigerant of the first refrigerant circuit flowing through the main condenser is condensed by a fluid flowing through the main condenser that is cooled solely by the free cooling circuit;
a first control valve that, when in an open position, enables fluid flowing through the free cooling circuit to flow through the main condenser; and
a second control valve that, when in a closed position, inhibits fluid flowing through the free cooling circuit to flow through the secondary condenser, which causes a refrigerant of the first refrigerant circuit flowing through the main condenser to be condensed by a fluid flowing through the main condenser that is cooled solely by the free cooling circuit.

2. The cooling system of claim 1, further comprising a third control valve,
wherein when the first and third control valves are placed in a closed position and the second control valve is placed in an open position, a refrigerant of the first refrigerant circuit is condensed by fluid flowing through the main condenser that is cooled by the chilled water circuit.

3. The cooling system of claim 2, wherein when the first, second, and third control valves are placed in a partially open position, the refrigerant of the first refrigerant circuit is condensed by a fluid flowing through the main condenser that is cooled by the free cooling circuit and the chilled water circuit.

4. The cooling system of claim 1, further comprising a water pump that pumps fluid through the chilled water circuit.

5. The cooling system of claim 4, wherein the second refrigerant circuit includes a compressor.

6. The cooling system of claim 5, wherein the chilled water circuit includes a one-way valve, wherein the one-way valve inhibits fluid from flowing from an inlet port of the evaporator and toward the water pump.

7. The cooling system of claim 1, wherein during a high wet-bulb temperature condition of ambient air, a refrigerant of the first refrigerant circuit flowing through the main condenser is condensed by a fluid flowing through the main condenser that is cooled by the chilled water circuit.

8. The cooling system of claim 7, further comprising a third control valve that, when in an open position, inhibits fluid flowing through the free cooling circuit to flow through the main condenser and enables fluid flowing through the free cooling circuit to flow through the secondary condenser,
wherein when the first control valve is in a closed position, the second control valve is in an open position, and the third control valve is in an open position, a refrigerant of the first refrigerant circuit flowing through the main condenser is condensed by a fluid flowing through the chilled water circuit.

9. The cooling system of claim 1, wherein during an intermediate wet-bulb temperature condition of ambient air, a refrigerant of the first refrigerant circuit flowing through the main condenser is condensed by a fluid flowing through the main condenser that is cooled by a combination of the free cooling circuit and chilled water circuit.

10. The cooling system of claim 9, wherein when a first, second, and third control valve are placed in a partially open position, a refrigerant of the first refrigerant circuit flowing through the main condenser is condensed by a fluid flowing through the main condenser that is cooled by a combination of the free cooling circuit and chilled water circuit.

11. The cooling system of claim 1, wherein the chilled water circuit includes a water pump that circulates fluid through the chilled water circuit, wherein the second refrigerant circuit includes a compressor that circulates a refrigerant through the second refrigerant circuit, and wherein the water pump and compressor are placed in an idle state during the low wet-bulb temperature condition.

12. A method of operating a cooling system, comprising: providing a cooling system, including:

a first refrigerant circuit in thermal communication with a heat load and in fluid communication with a main condenser;

a free cooling circuit in fluid communication with the main condenser and a free-cooled water source, the free cooling circuit being in thermal communication with the first refrigerant circuit via the main condenser;

a chilled water circuit in fluid communication with the main condenser and an evaporator, the chilled water circuit being in thermal communication with the first refrigerant circuit via the main condenser; and a second refrigerant circuit in fluid communication with the evaporator and a secondary condenser, the second refrigeration circuit being in thermal communication with the chilled water circuit and the free cooling circuit, wherein during a low wet-bulb temperature condition of ambient air, a refrigerant of the first refrigerant circuit flowing through the main condenser is condensed by a fluid flowing through the main condenser that is cooled solely by the free cooling circuit;

placing a first control valve in an open position to enable fluid flowing through the free cooling circuit to flow through the main condenser; and placing a second control valve in a closed position to inhibit fluid flowing through the free cooling circuit to flow through the secondary condenser, thereby causing a refrigerant of the first refrigerant circuit flowing through the main condenser to be condensed by a fluid flowing through the main condenser that is cooled solely by the free cooling circuit.

13. The method of claim 12, wherein during a high wet-bulb temperature condition of ambient air, a refrigerant of the first refrigerant circuit flowing through the main condenser is condensed by a fluid flowing through the main condenser that is cooled by the chilled water circuit.

14. The method of claim 13, further including placing a first control valve in a closed position, a second control valve in an open position, and a third control valve in an open position to inhibit fluid flowing through the free cooling circuit to flow through the main condenser and to enable fluid flowing through the free cooling circuit to flow through the secondary condenser thereby causing a refrigerant of the first refrigerant circuit flowing through the main condenser to be condensed by a fluid flowing through the chilled water circuit.

15. The method of claim 12, wherein during an intermediate wet-bulb temperature condition of ambient air, a refrigerant of the first refrigerant circuit flowing through the main condenser is condensed by a fluid flowing through the main condenser that is cooled by a combination of the free cooling circuit and chilled water circuit.

16. The method of claim 15, wherein when the first control valve, the second control valve, and a third control valve are placed in a partially open position, a refrigerant of the first refrigerant circuit flowing through the main condenser is condensed by a fluid flowing through the main condenser that is cooled by a combination of the free cooling circuit and chilled water circuit.

17. The method of claim 12, wherein the chilled water circuit further includes a water pump and the second refrigerant circuit includes a compressor, the water pump capable of circulating fluid through the chilled water circuit and the compressor capable of circulating a refrigerant through the second refrigerant circuit, and wherein during a low wet-bulb temperature condition the water pump and compressor are placed in an idle state.

18. A cooling system comprising:

a first refrigerant circuit in thermal communication with a heat load and in fluid communication with a main condenser;

a free cooling circuit in fluid communication with the main condenser and a free-cooled water source, the free cooling circuit being in thermal communication with the first refrigerant circuit via the main condenser;

a chilled water circuit in fluid communication with the main condenser and an evaporator, the chilled water circuit being in thermal communication with the first refrigerant circuit via the main condenser; and a second refrigerant circuit in fluid communication with the evaporator and a secondary condenser, the second refrigeration circuit being in thermal communication with the chilled water circuit and the free cooling circuit, wherein during a low wet-bulb temperature condition of ambient air, a refrigerant of the first refrigerant circuit flowing through the main condenser is condensed by a fluid flowing through the main condenser that is cooled solely by the free cooling circuit, and wherein during an intermediate wet-bulb temperature condition of ambient air, a refrigerant of the first refrigerant circuit flowing through the main condenser is condensed by a fluid flowing through the main condenser that is cooled by a combination of the free cooling circuit and chilled water circuit.

19. The cooling system of claim 18, further comprising:

a first control valve in fluid communication with the secondary condenser; and a second control valve in fluid communication with the main condenser and the evaporator, wherein when the first control valve is placed in an open position and the second control valve is placed in a closed position, a refrigerant of the first refrigerant circuit is condensed by a fluid flowing through the main condenser that is cooled solely by the free cooling circuit.

* * * * *